(12) United States Patent
Miyahara

(10) Patent No.: US 7,320,177 B2
(45) Date of Patent: Jan. 22, 2008

(54) RADIATOR AND METHOD OF MANUFACTURING THE SAME

(75) Inventor: Hideyuki Miyahara, Nagano (JP)

(73) Assignee: Nakamura Seisakusho Kabushikigaisha, Nagano-Ken (JP)

( * ) Notice: Subject to any disclaimer, the term of this patent is extended or adjusted under 35 U.S.C. 154(b) by 245 days.

(21) Appl. No.: 11/041,512

(22) Filed: Jan. 24, 2005

(65) Prior Publication Data
US 2005/0193559 A1    Sep. 8, 2005

(30) Foreign Application Priority Data
Jan. 28, 2004    (JP)    ............... 2004-019126

(51) Int. Cl.
B21D 53/02    (2006.01)

(52) U.S. Cl. ............... 29/890.03; 257/E23.103; 361/697

(58) Field of Classification Search ............. 29/890.03, 29/832; 257/E23.109, E23.105, E23.103, 257/722; 165/181, 185, 104.15, 170; 361/709, 361/697
See application file for complete search history.

(56) References Cited

U.S. PATENT DOCUMENTS

| | | | | |
|---|---|---|---|---|
| 3,692,105 A | * | 9/1972 | O'Connor | .................. 165/181 |
| 3,850,236 A | * | 11/1974 | O'Connor et al. | .......... 165/181 |
| 3,886,639 A | * | 6/1975 | Pasternak | .................... 72/325 |
| 3,901,312 A | * | 8/1975 | Pasternak | ................... 165/181 |
| 3,947,941 A | * | 4/1976 | O'Connor et al. | ............ 72/324 |
| 4,203,311 A | * | 5/1980 | O'Connor et al. | ............ 72/254 |
| 4,637,111 A | * | 1/1987 | Pasternak et al. | ........ 29/890.05 |
| 6,341,651 B1 | * | 1/2002 | Ohta | ......................... 165/185 |
| 6,349,762 B2 | * | 2/2002 | Ohta | ......................... 165/185 |
| 6,845,647 B2 | * | 1/2005 | Sun | .............................. 72/325 |
| 2004/0187307 A1 | * | 9/2004 | Wong | ........................ 29/832 |

FOREIGN PATENT DOCUMENTS

JP    2001-102782    4/2001

* cited by examiner

Primary Examiner—David P. Bryant
Assistant Examiner—Alexander P Taousakis
(74) Attorney, Agent, or Firm—Flynn, Thiel, Boutell & Tanis, P.C.

(57) ABSTRACT

In a method of manufacturing a radiator, the blade of a carving tool is applied at a specific angle to the surface of a metal plate with a high coefficient of thermal conductivity, the carving tool is advanced while the angle is maintained, and the surface of the metal plate is carved out to form plate-shaped heat-radiating fins vertically upward. A radiator is manufactured in which a plurality of heat-radiating fins are integrally formed vertically upward at a specific pitch from a single metal plate by repeating a step in which the carving tool is retracted at a specific pitch, the metal plate is carved out, and a heat-radiating fin is formed. A radiator that has high radiation efficiency and is highly safe during handling can be manufactured at low cost.

6 Claims, 20 Drawing Sheets

(A)

(B)

(C)

(D)

(E)

RADIATOR AND METHOD OF MANUFACTURING THE SAME

BACKGROUND OF THE INVENTION

1. Technical Field

The present invention relates to a radiator for efficiently dissipating heat produced by semiconductor integrated circuits and other such electronic components, and to a method of manufacturing a radiator for raising up plate-shaped heat-radiating fins from a metal plate and integrally forming a radiator.

2. Related Art Description

Semiconductor integrated circuits and other such electronic components, which are constantly shrinking in size and increase in density, generate heat during use. Therefore, radiators for radiating heat are attached to packages for accommodating the electronic components. Forced cooling by a cooling fan can also be performed as needed.

Radiators commonly used for heat radiation in semiconductor integrated circuits and other such electronic components have a configuration wherein multiple pectinate heat-radiating fins stand straight up on a base. Bonding the radiator to the package allows the heat produced by the semiconductor integrated circuit during operation to be transmitted to the radiator and dissipated to the exterior. Such a radiator is normally manufactured by extruding or casting a metallic material with a satisfactory coefficient of thermal conductivity composed of aluminum.

One example of a radiator is disclosed in Patent Document 1 listed below. The radiator disclosed herein is provided with multiple tongue-shaped fins disposed at intervals in the longitudinal direction. Such tongue-shaped fins are formed by a method in which rectangular convexities are formed on the top surface by extrusion molding an aluminum extrusion moldable material, and the convexities are then cut out with a cutting tool.

Generally, the radiation efficiency of the radiator is substantially proportional to the surface area of the entire radiator. Therefore, multiple heat-radiating fins must be formed and the surface area increased in order to enhance the heat radiation effect of the radiator. However, since the former of the two radiator types is manufactured by extrusion molding or casting, there is a limit to how thin the heat-radiating fins can be made and how many heat-radiating fins can be formed, and it has been difficult to enhance the heat radiation effect.

Also, multiple heat-radiating fins can be formed in the method of manufacturing the latter radiator type disclosed in Patent Document 1, but the plate thickness of the base portion of the extrusion moldable material increases because the rectangular convexities formed on the top surface of the extrusion moldable material are cut out with a cutting tool. Therefore, the radiation efficiency is low because the heat from the heating element provided to the back surface of the radiator sometimes does not reach the tongue-shaped fins, and the radiating effects of the tongue-shaped fins cannot be achieved. Also, copper has a higher coefficient of thermal conductivity than aluminum, and although fashioning radiators from a copper material is inherently desirable, the problem with copper is that it cannot be extrusion-molded as shown in Patent Document 1. Therefore, the problem is that aluminum, which has a poor coefficient of thermal conductivity, must be used when extrusion molding is employed.

Because of such reasons, when tongue-shaped fins are formed by the method disclosed in Patent Document 1, the corners on both sides at the distal end of the tongue-shaped fins are formed into roughly 90-degree angles, and edges are formed in these corners, for which reason there is a danger that injury will be sustained by contact with the hands and other body parts of workers during manufacture, transport, or assembly into electronic device. There is also a danger of damage to components that come into contact with the corners of the tongue-shaped fins when radiators come into contact with each other, or with electronic devices or the like.

[Patent Document 1] JP-A 2001-102782

SUMMARY OF THE INVENTION

The primary object of the present invention is to provide a radiator that has high heat radiation efficiency, can be manufactured inexpensively, and offers markedly enhanced safety during handling, and a method of manufacturing the same.

To attain the stated object, the present invention proposes a method of manufacturing a radiator with a configuration wherein a plurality of thin-plate heat-radiating fins are raised vertically from a first surface of a metal plate, comprising:

heat-radiating fin formation step wherein a blade of a carving tool is applied to a first surface of a metal plate and the blade is advanced in relative fashion in a direction inclined by a specific angle along the first surface, whereby the blade is dug in towards a second surface of the metal plate to form a plate-shaped heat-radiating fin that rises vertically from a portion on a side of the first surface of the metal plate; and tool retraction step wherein the blade is retracted relative to the formed heat-radiating fin by a specific pitch along the first surface of the metal plate; wherein the heat-radiating fin formation step and the tool retraction step are repeated to form a plurality of the heat-radiating fins at a specific pitch in the first surface of the metal plate; and a thickness of the portions of the metal plate between adjacent heat-radiating fins is less than a thickness of the other portions of the metal plate.

According to the present invention, a plurality of heat-radiating fins can be consecutively formed in a metal plate made of aluminum, copper, or another such metal with a good coefficient of thermal conductivity by sequentially repeating steps wherein a carving tool having a specific angle is used to carve out the surface of the metal plate and to integrally form heat-radiating fins vertically upward. A radiator in which thin-plate heat-radiating fins are formed can thereby be easily manufactured.

Also, since the carving tool is sunk in towards the back surface of the metal plate to form heat-radiating fins vertically upward, the thickness of the portions of the metal plate between each heat-radiating fin is less than the thickness of the other portions of the metal plate. Accordingly, the heat from the heat source provided to the back surface of the metal plate is quickly transmitted to the plurality of heat-radiating fins, and the heat radiation effect can be increased. Also, since the metal plate and the heat-radiating fins are formed integrally, the heat radiation effect can be further enhanced because heat is transmitted to the heat-radiating fins without thermal insulation.

The metal plate herein is a continuous plate with a specific width, the carving tool is advanced in relative fashion in a length direction of the metal plate in the heat-radiating fin formation step, and the heat-radiating fins extending in a width direction of the metal plate are formed at a specific pitch along the length direction of the metal plate.

When a continuous metal plate is used, a plurality of heat-radiating fins can be consecutively formed by sequentially repeating steps wherein one side of the metal plate is carved out with a carving tool to integrally form heat-radiating fins vertically upward, and manufacturing efficiency can be increased.

Also, the method of the present invention includes a cutting step wherein, after the plurality of heat-radiating fins are formed, the metal plate is cut out at each portion in which a specific number of the heat-radiating fins are formed to manufacture a plurality of radiators.

Cutting a continuous metal plate at specific intervals after consecutively forming heat-radiating fins in the plate makes it possible to easily manufacture a radiator with an arbitrary size and length.

Furthermore, the carving tool that can be used is one that has a blade extending in a direction perpendicular to a carving direction in a distal end at a bottom thereof, and a tapered blade is formed at both ends of the blade.

In this case, in the heat-radiating fin formation step, both sides of the heat-radiating fins are cut with the tapered blade, and the heat-radiating fins are formed by a portion of the blade positioned therebetween. Accordingly, burrs and the like can be prevented from forming in the lateral surfaces of the heat-radiating fins, electrical shorts and other such accidents due to burrs being shed into the interior of electronic devices or the like can be prevented before they occur, and the commercial value of the radiator itself or of electronic devices or the like can be enhanced.

Furthermore, the blade surface of the carving tool that can be used comprises a first inclined surface that is inclined rearward from the distal end of the bottom surface at a specific angle, a stepped surface that protrudes forward from a top end of the first inclined surface at a specific angle, and a second inclined surface that is inclined rearward from a top end of the stepped surface at a specific angle; and a portion where the bottom surface and the first inclined surface intersect constitutes the blade.

When heat-radiating fins are formed by the carving tool in which two inclined surfaces are formed in the blade at a specific angle, the heat-radiating fins can be curled to an arbitrary size according to the difference in angles between the two inclined surfaces. As a result of curling, the danger of coming into contact with the sharp distal ends of the heat-radiating fins can be avoided before it happens, and the danger of injuries to workers handling the radiator can be prevented before it happens.

Next, the method of the present invention includes a pier formation step preceding the heat-radiating fin formation step, wherein the second surface on the side opposite from the first surface in the metal plate is pressed toward the first surface by a pressing tool, and a pier smoothed off at the two lateral corners is formed in the first surface of the metal plate, wherein in the heat-radiating fin formation step, heat-radiating fins whose both lateral portions at the distal ends are circular or chamfered are formed by carving out the pier with the carving tool in which the blade is formed wider than a width of the pier.

Since both sides at the distal ends of the heat-radiating fins are formed to be circular or chamfered, it is possible to prevent the danger of injury to workers handling the radiator before it happens. Also, damage due to contact between radiators or contact with electronic devices or the like can be prevented before it happens, and the commercial value of the radiator itself or of electronic devices or the like can be enhanced.

When interlocking parts for holding the metal plate in an immobile state are formed in both end portions of the metal plate, the pier can be formed in a portion of the metal plate between the interlocking parts in the pier formation step, the interlocking parts can be used to fix the metal plate in place during the heat-radiating fin formation step, and only the carving tool can be moved.

Next, the present invention provides a radiator with a configuration wherein thin-plate heat-radiating fins are integrally formed in a metal plate, wherein a plurality of heat-radiating fins are integrally formed vertically upward at a specific pitch in a first surface of the metal plate composed of aluminum, copper, or another such metal with a good coefficient of thermal conductivity, by continuously and repeatedly carving out the surface with a carving tool, and metal plate portions that are thinner than the other metal plate portions are formed between adjacent heat-radiating fins by carving with the carving tool.

The heat-radiating fins herein gradually decrease in thickness from a base on a side of the metal plate towards distal ends, and also are curled from the base to the distal ends.

The present invention further proposes a heat-radiating fin formation method for integrally forming plate-shaped heat-radiating fins in a surface of a metal plate, wherein the surface of the metal plate is slanted in relation to a moving flat surface of a blade of a carving tool by a specific angle so that a direction in which the blade moves forward faces up, and the surface of the metal plate is carved out by the carving tool, whereby plate-shaped heat-radiating fins are raised vertically, with distal ends of the heat-radiating fins curled towards the surface of the metal plate.

Also, a plurality of heat-radiating fins are formed in the metal plate at a specific pitch by repeating steps wherein the surface of the metal plate is carved out to form the heat-radiating fins from a position in which the blade of the carving tool is retracted by a specific pitch in relation to the heat-radiating fins.

Furthermore, the thickness of the heat-radiating fins at a base on the side of the metal plate surface is increased and the distal ends thereof are reduced in thickness by the resistance created when the heat-radiating fins cause the blade surface to slide as frictional force of the blade surface of the carving tool is increased to carve out the metal plate.

DETAILED DESCRIPTION OF THE PREFERRED EMBODIMENTS

Examples of a method of manufacturing a radiator and a radiator according to the present invention will now be described with reference to the drawings.

The radiator of the present invention, wherein thin plate-shaped heat-radiating fins are integrally formed on a metal plate, is manufactured as follows. First, a metal plate of aluminum, copper, or another such metal with a good coefficient of thermal conductivity is prepared. The blade of a carving tool is applied to this metal plate, and the blade is moved relative to the metal plate. The metal plate is thereby carved out by the blade of the carving tool, a plate-shaped heat-radiating fin is raised vertically from the metal plate, and a single heat-radiating fin is integrally formed in the metal plate. Next, the blade of the carving tool is retracted relative to the metal plate, the metal plate is carved by the carving tool from a position on the side behind the heat-radiating fin by a specific pitch, and the next plate-shaped heat-radiating fin is raised vertically from the metal plate. Repeating this carving step results in a radiator with a configuration wherein a plurality of heat-radiating fins are continuously formed in the surface of a metal plate.

EXAMPLE 1

Figure 1:
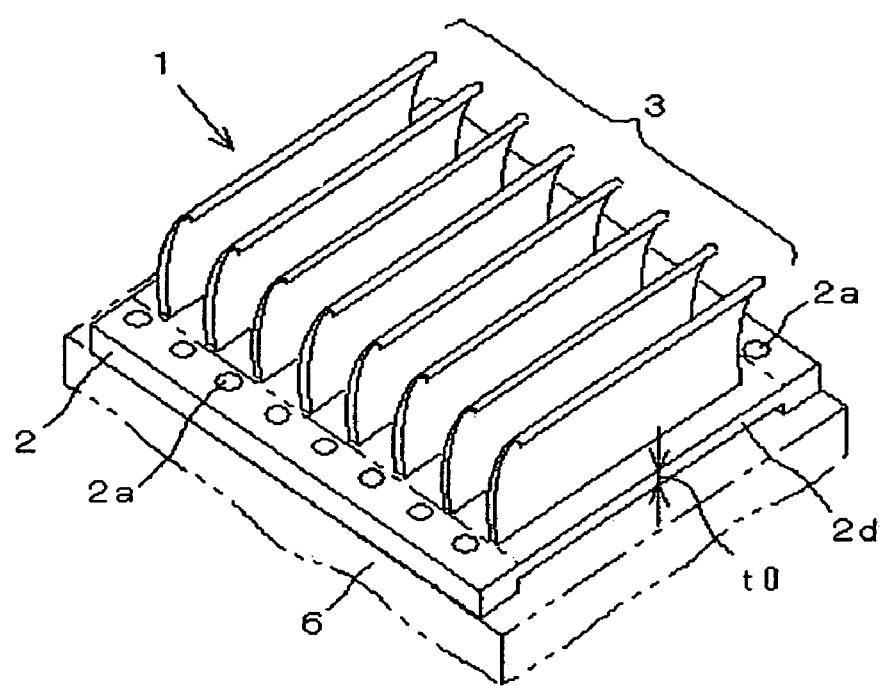
FIG. 1 is a perspective view depicting a radiator according to Example 1 of the present invention.
Figure 2:
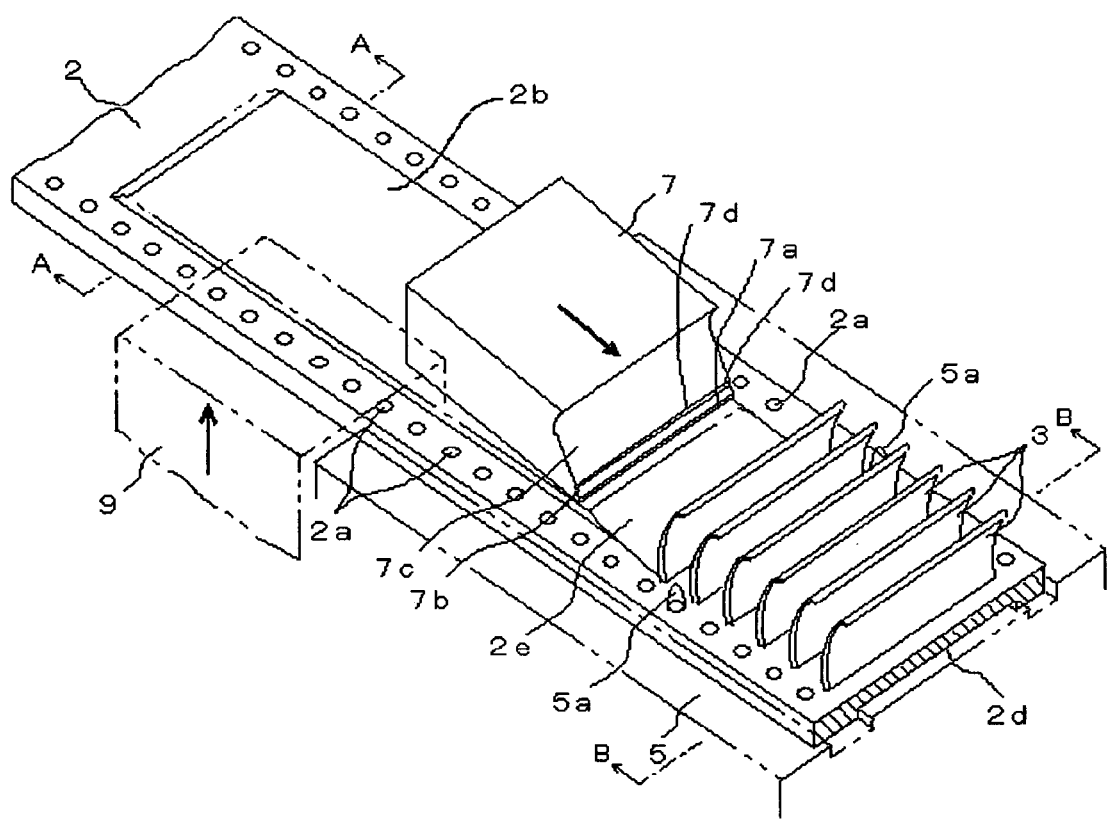
FIG. 2 is a perspective view depicting a method of manufacturing the radiator in FIG. 1.
Figure 3:
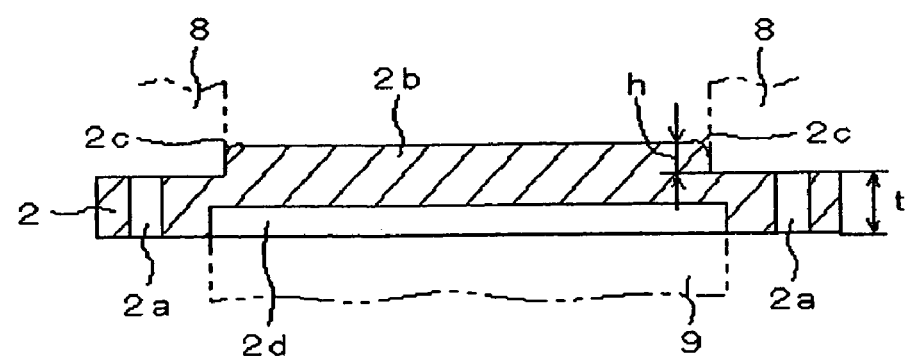
FIG. 3 is a cross-sectional view depicting the portion cut along line A-A in FIG. 2.
Figure 4:
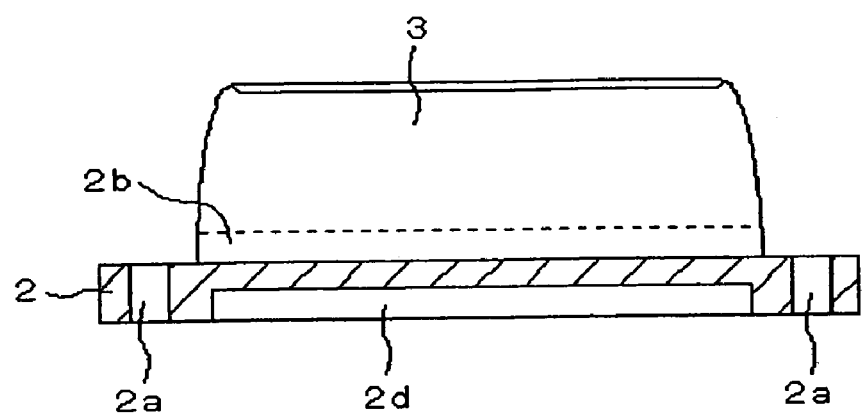
FIG. 4 is a cross-sectional view depicting the portion cut along line B-B in FIG. 2.

FIG. 1 is a perspective view depicting a radiator according to Example 1 of the present invention, FIG. 2 is a perspective view depicting a method of manufacturing the radiator of FIG. 1; FIG. 3 is a cross-sectional view depicting the portion that is cut along line A-A of FIG. 2, and FIG. 4 is a cross-sectional view depicting the portion that is cut along line B-B of FIG. 2. The metal material used in the radiator in this example is capable of being subjected to plastic working, and also has a good coefficient of thermal conductivity. For example, a metal plate with a specific plate thickness formed from aluminum, an aluminum alloy, a copper alloy, stainless steel, or another such material can be used.

The radiator 1 of the present example is configured from a metal plate 2 and a plurality of heat-radiating fins 3 formed integrally on the surface thereof. The heat-radiating fins 3 extend parallel to the narrow side of the metal plate 2. Also, this plurality of heat-radiating fins 3 protrude at substantially the same angle and are formed parallel at substantially equal intervals. Furthermore, the heat-radiating fins 3 are formed thick at the bottom ends connected to the metal plate 2, and become thinner towards the distal ends.

The distal end portions of the heat-radiating fins 3 are curled so as to face the surface of the metal plate 2. Curling the distal end portions of the heat-radiating fins 3 makes it possible to prevent injuries and other such accidents before they occur because the worker or the like cannot come into direct contact with the sharp distal ends. Also, the corners of the distal end portions of the heat-radiating fins 3 are formed into circular or chamfer shapes as shown in FIG. 3. Accordingly, it is possible to prevent the danger of these portions injuring the workers handling the radiator in advance. Furthermore, since damage resulting from contact between radiators or contact with an electronic device or the like can be prevented before it happens, the radiator itself or the electronic device or the like is not damaged, and the commercial value thereof can therefore be increased.

Next, the thickness of the heat-radiating fins 3 can be reduced because the heat-radiating fins are formed by carving out the metal plate 2. For example, a thickness of about 0.5 mm to 0.1 mm is suitable for the heat-radiating fins of a radiator used in small electronic components. The thickness of the heat-radiating fins 3 may be the same or may vary from fin to fin. Furthermore, if the thickness of the heat-radiating fins 3 is made to be greater at the bottom end and to decrease towards the distal end portions, then the base is thicker and therefore has a greater heat capacity and easily absorbs heat from the metal plate 2. Heat can thereafter be sequentially radiated as it is transmitted towards the distal end portions, and can easily be radiated even if the distal end portions have a low heat capacity. Since the heat-radiating fins 3 vary in thickness in conjunction with the transmission and radiation of heat, the radiator 1 with high radiation efficiency can be obtained.

Next, FIGS. 2 through 8 depict the method of manufacturing the radiator 1. Also, FIG. 9 depicts the blade of the carving tool used to manufacture the radiator 1. The method of manufacturing the radiator 1 will now be described with reference to these drawings.

In the present example, a continuous metal plate with a constant width is used as the metal plate 2. The metal plate 2 has necessary thickness and width for forming the radiator 1, and is wound around a supply device, which is not illustrated. In the metal plate 2 sequentially supplied from the supply device, pilot holes 2a that function as interlocking parts for setting the metal plate 2 in place in relation to the moving direction of the carving tool are formed in advance at substantially the same pitch as the heat-radiating fins 3 are formed by a press device (not shown). A pier 2b of a specific length that protrudes on the side of the surface in the drawing is formed in the metal plate 2 with the pilot holes 2a in the pier formation step shown in FIG. 5(A).

Specifically, as a die 8 is brought into contact with both sides of the front surface of the hoop-shaped metal plate 2 as shown by the double-dashed line in FIG. 3, a press tool 9 is pressed from the rear surface to form a concavity 2d. At this time, the material in the concavity 2d moves to the interior of the die 8 and the surface side of the hoop-shaped metal plate 2 protrudes forward, forming the pier 2b. Then, when the material moves, the corners 2c on the two sides of the pier 2b are formed in arcuate shapes, as shown in FIG. 3. The extent by which the two lateral corners 2c are rounded out can be somewhat arbitrarily set by appropriately setting the opening dimensions of the die 8 and the width of the press tool 9. In other words, if the width of the press tool 9 is set to be less than the opening dimensions of the die 8, the two lateral corners 2c can be greatly rounded out, and if, conversely, the width of the press tool 9 is set to be greater than the opening dimensions of the die 8, the two lateral corners 2c can be rounded out to a lesser extent. Also, if a concavity (not shown) is formed in the die 8 and the inner corners of this concavity are formed into a tapered, circular, or other such arbitrary shape, then the two lateral corners 2c may be formed according to the shape of the inner corners when the press tool 9 is pressed from the other side of the hoop-shaped metal plate 2.

Figure 5:
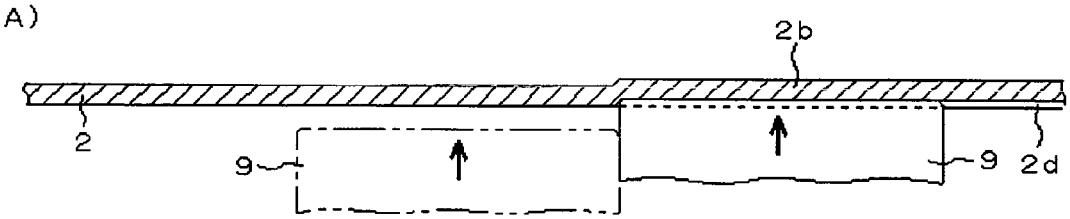
FIGS. 5(A) through 5(E) are explanatory diagrams depicting heat-radiating fin formation step in a method of manufacturing the radiator in FIG. 1.
Figure 5:
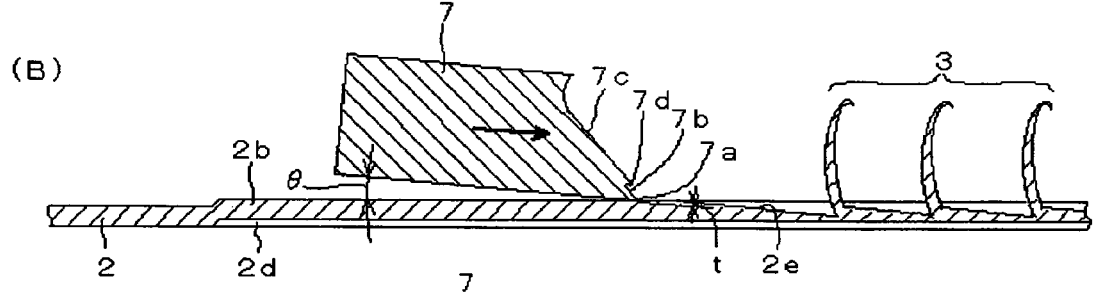
Figure 5:
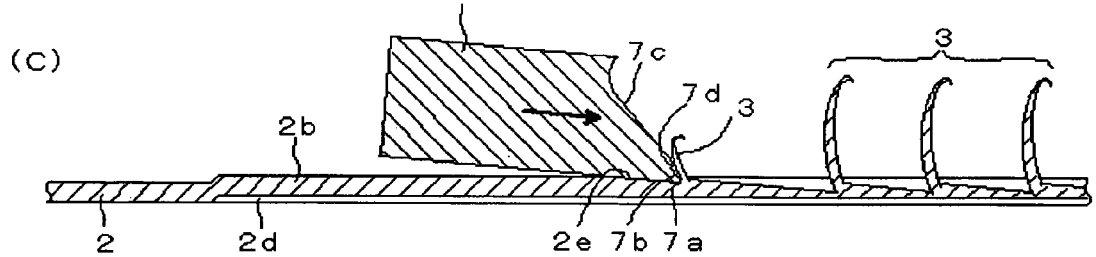
Figure 5:
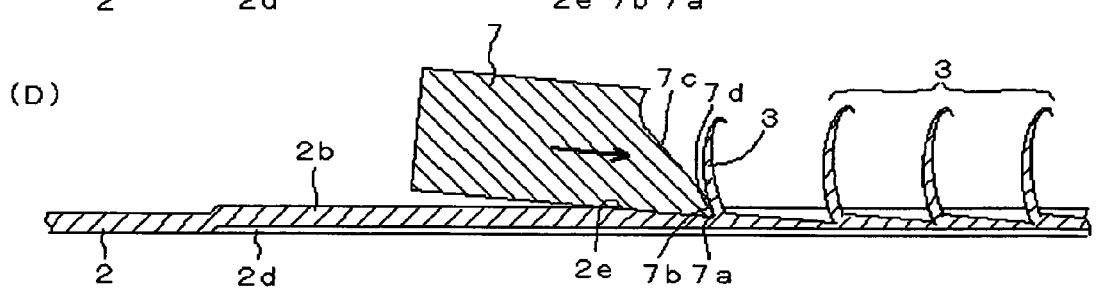
Figure 5:
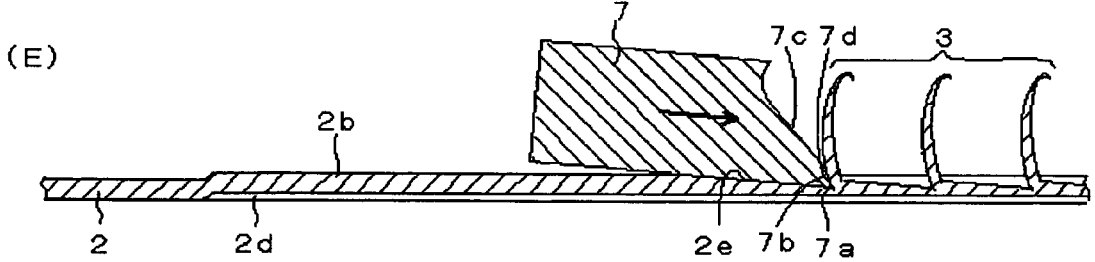
Figure 6:
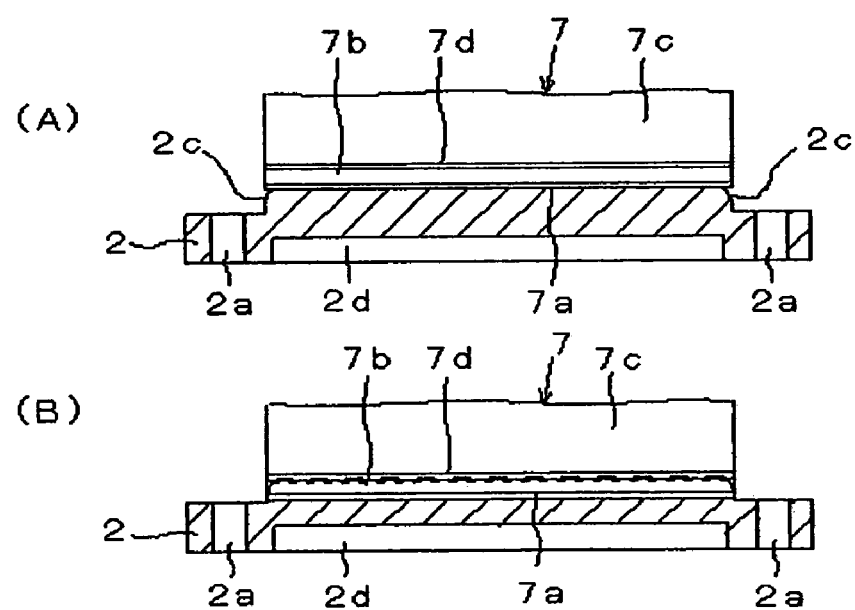
FIGS. 6(A) and 6(B) are explanatory diagrams depicting heat-radiating fin formation step in FIG. 5 as seen from a side perpendicular thereto.
Figure 7:
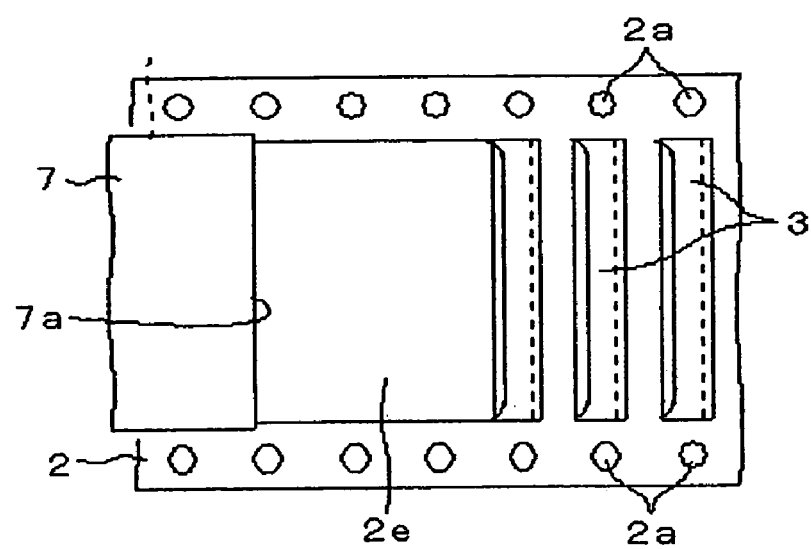
FIG. 7 is an explanatory diagram depicting heat-radiating fin formation step in FIG. 5 as seen from above.

Thus, the pier formation step for forming the pier 2b is performed prior to the fin formation step described later, and the length of the pier 2b in the longitudinal direction of the hoop-shaped metal plate 2 can be equal to several times to several dozen times the pitch at which the heat-radiating fins 3 are formed. Therefore, the press tool 9 for forming the pier 2b is formed into a small rectangle as shown in FIGS. 2 and 5, and the press tool 9 is pressed to form the pier 2b every time a specific number of the heat-radiating fins 3 is formed.

The height h of the pier 2b is preferably set to approximately 0.2 to 0.9 times the thickness t of the hoop-shaped metal plate 2. When the height h of the pier 2b is less than 0.2, the height of the heat-radiating fins 3 formed in the fin formation step described later is insufficient, and the heat radiating performance necessary for the radiator 1 cannot be obtained. Also, when the height h of the pier 2b is greater than 0.9, there is a danger of the pier 2b becoming separated in the fin formation step described later because the connecting dimensions of the hoop-shaped metal plate 2 and the pier 2b are reduced. It is preferable to set the width of the press tool 9 to be greater than the opening dimensions of the die 8 as shown in FIG. 3, so as to prevent the pier 2b from separating from the hoop-shaped metal plate 2.

The hoop-shaped metal plate 2 in which the pier 2b is formed in the pier formation step as described above is then transferred to the fin formation step. Specifically, the hoop-shaped metal plate 2 is mounted on the die 5 shown in FIG. 2. At this time, the pilot holes 2a fit over pilot pins 5a formed in the die 5 to set the position of the hoop-shaped metal plate 2. Then, as shown in FIGS. 4 and 5, the pier 2b of the hoop-shaped metal plate 2 mounted on the die 5 is carved out by a carving tool 7, and the heat-radiating fins 3 are formed integrally in a state in which they rise vertically from the surface of the metal plate 2.

FIG. 9 is a partial cross-sectional view depicting the blade of the carving tool. The carving tool 7 used in the present example has a blade 7a perpendicular to the direction of movement formed in the distal end on the side of the bottom surface as shown in FIG. 9(A), which has a width either equal to or somewhat greater than the width of the pier 2b formed in the hoop-shaped metal plate 2. Furthermore, two inclined surfaces 7b and 7c are formed, which are inclined at specific angles upward from the blade 7a. These two inclined surfaces 7b and 7c are formed to be parallel to each other, the inclined surface 7c is formed higher than the other inclined surface 7b that continues from the blade 7a, and a step 7d is formed between the two surfaces. The carving tool 7 with this shape is inclined by a specific angle θ in relation to the hoop-shaped metal plate 2 so that the back end is higher, and is affixed to a drive device that is now shown (see FIG. 5(B)). The inclination angle θ of the carving tool 7 is appropriately set according to the height and thickness of the heat-radiating fins 3, or the material and the like of the hoop-shaped metal plate 2, and is generally set to 3 to 20 degrees.

After the carving tool 7 is brought into contact with the pier 2b of the hoop-shaped metal plate 2 as shown in FIG. 5(B), the carving tool 7 is moved at a specific angle to the back surface of the hoop-shaped metal plate 2 by a drive device. At this point, the pier 2b of the hoop-shaped metal plate 2 is carved out by the blade 7a at the distal end of the carving tool 7, and the distal end of a thin heat-radiating fin 3 is made to rise vertically. When the distal end of the heat-radiating fin 3 reaches the step 7d of the carving tool 7, the distal end of the heat-radiating fin 3 is caused to bend and change direction by the top edge thereof. When the carving tool 7 is moved further, the pier 2b of the hoop-shaped metal plate 2 is carved out gradually deeper as shown in FIG. 5(D), and the heat-radiating fin 3 grows longer. Then, when the carving tool 7 is moved to a specific position, as shown in FIG. 5(E), the heat-radiating fin 3 of a specific height is made to rise vertically from the pier 2b of the hoop-shaped metal plate 2. After the heat-radiating fin 3 is carved out, a slightly inclined worked surface 2e remains in part of the pier 2b. The carving tool 7 then retracts to a standby position.

After the heat-radiating fin 3 is formed, the next heat-radiating fin 3 is formed, whereupon the hoop-shaped metal plate 2 moves downstream towards the right side in FIG. 2, and the pilot pins 5a formed in the die 5 is fit into the pilot holes 2a to set the position of the hoop-shaped metal plate 2. The carving tool 7 is then moved and the blade 7a is brought into contact with a portion on the surface of the pier upstream of the worked surface 2e, as shown in FIG. 5(B). This contact position is set to a position that results in a specific carving depth t in the back surface of the hoop-shaped metal plate 2 from the worked surface 2e. The carving depth t is set to about 0.3 mm to 0.8 mm.

Then, the carving tool 7 is moved toward the back surface from the top surface of the pier 2b of the hoop-shaped metal plate 2 at a specific angle, the hoop-shaped metal plate 2 is carved out by the blade 7a at the distal end of the carving tool 7, and the distal end of the thin heat-radiating fin 3 is raised vertically as shown in FIG. 5(C). At this time, the distal end of the heat-radiating fin 3 is made to curve and change direction by the step 7d of the carving tool 7. When the carving tool 7 is moved further, the pier 2b of the hoop-shaped metal plate 2 is carved out gradually deeper as shown in FIG. 5(D), and the heat-radiating fin 3 grows longer. Then, when the carving tool 7 is moved to a specific position as shown in FIG. 5(E), the heat-radiating fin 3 of a height substantially equal to that of the previously formed heat-radiating fin 3 is formed while made to rise vertically, and a worked surface 2e remains in the pier 2b. The carving tool 7 then again retracts and returns to the standby position.

Furthermore, in order to form the next heat-radiating fin 3, the hoop-shaped metal plate 2 is moved downstream and is positioned by the pilot pins 5a formed in the die 5, and then the blade 7a of the carving tool 7 is brought into contact farther upstream than the worked surface 2e, and the carving tool 7 is moved to form the heat-radiating fin 3 as previously described. A plurality of heat-radiating fins 3 are formed continuously at a specific pitch on the pier 2b of the hoop-shaped metal plate 2, as shown in FIG. 8, by repeating this raising formation step.

Both sides at the distal ends of the heat-radiating fins 3 thus formed are formed into rough arcuate shapes as shown in FIG. 4. In other words, the two lateral corners are rounded out into arcuate shapes when the pier 2b is formed on the front surface of the hoop-shaped metal plate 2 as previously described. If the two lateral corners of the pier 2b are carved out by the carving tool 7 in the fin formation step, both sides of the distal ends of the heat-radiating fins 3 are formed to gradually widen along the arcuate shapes from the top surface of the narrow pier 2b. Therefore, both sides of the distal ends of the heat-radiating fins 3 are formed into the same shapes as the arcuate shapes formed at the two lateral corners of the pier 2b. The danger of the workers being injured by the edges can be prevented before it happens because there are no sharp edges due to both sides of the distal ends of the heat-radiating fins 3 being formed into rough arcuate shapes.

Figure 8:
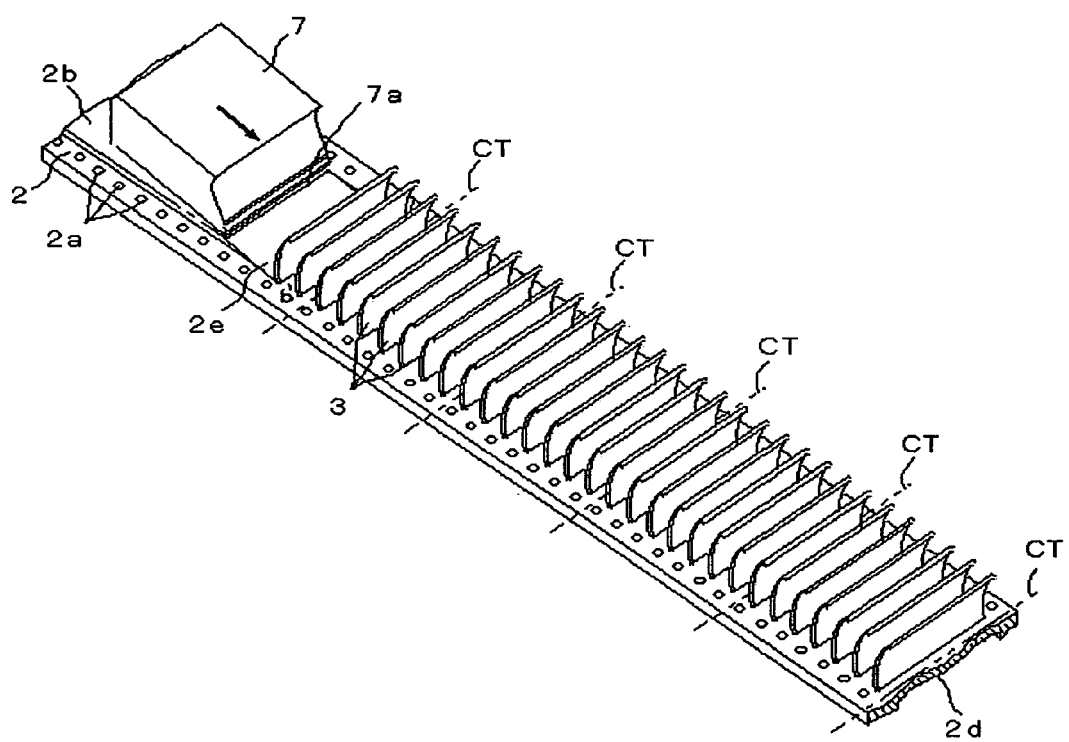
FIG. 8 is a perspective view depicting the method of manufacturing the radiator in FIG. 1, and depicts the heat-radiating fins as being formed continuously.
Figure 9:
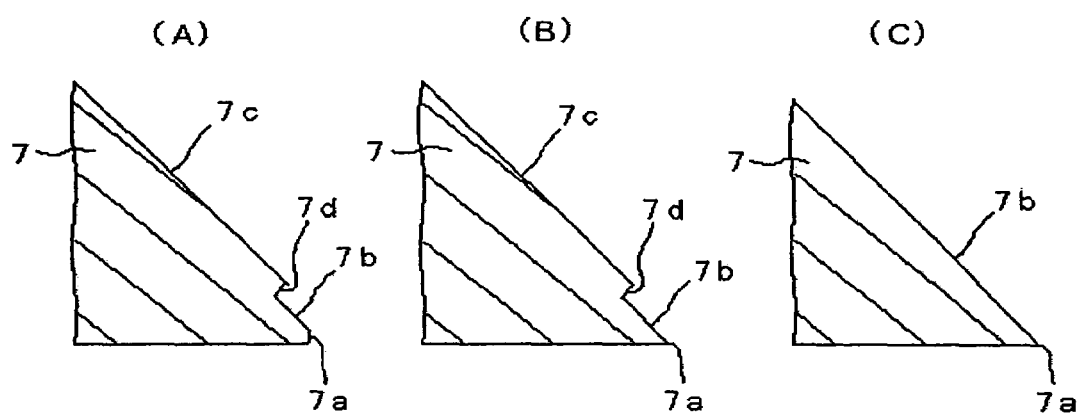
FIGS. 9(A) through 9(C) are cross-sectional views depicting the shape of the distal end of the carving tool used in the method of manufacturing the radiator in FIG. 1.

After the heat-radiating fins 3 are thus formed, they are cut at the cut lines CT shown by the double-dashed lines in FIG. 8, and the radiator 1 shown in FIG. 1 is obtained. Intervals between these cut lines CT are set every specific number of heat-radiating fins 3. The pilot holes 2a used in the raising formation step of the heat-radiating fins 3 remain in the radiator 1 shown in FIG. 1, and these pilot holes 2a may be either entirely or partially left to be used as mounting holes, or, if necessary, the pilot holes 2a as interlocking parts may be removed by cutting at the two lateral positions of the heat-radiating fins 3 as shown by the double-dashed lines.

A chamfer is formed in the blade 7a of the carving tool 7 as shown in FIG. 9(A). Since the carving tool 7 carves out the hoop-shaped metal plate 2 by means of the blade 7a, the longevity of the blade 7a is shortened when it is formed with a sharp corner. However, it is possible to extend the longevity by forming the chamfer. Also, the carving tool 7 has the step 7d formed near the blade 7a, but only one inclined surface 7b may be formed as shown in FIG. 9(C) depending on the shape of the carved heat-radiating fins 3.

When the carving tool 7 is moved to carve out the heat-radiating fins 3, the heat-radiating fins 3 gradually increase in height while the inclined surface 7b of the carving tool 7 is rubbed against. Therefore, the thickness of the heat-radiating fins 3 varies depending on the extent of the friction resistance in the front of the inclined surface 7b. Specifically, the heat-radiating fins 3 are formed to be thicker when the inclined surface 7b has high friction resistance, and the fins are formed thinner when the friction resistance is low. Therefore, the friction resistance of the carving tool 7 must be kept constant in order to achieve the desired thickness in the heat-radiating fins 3. It is also possible to control the thickness of the heat-radiating fins 3 by varying the friction resistance.

EXAMPLE 2

Figure 10:
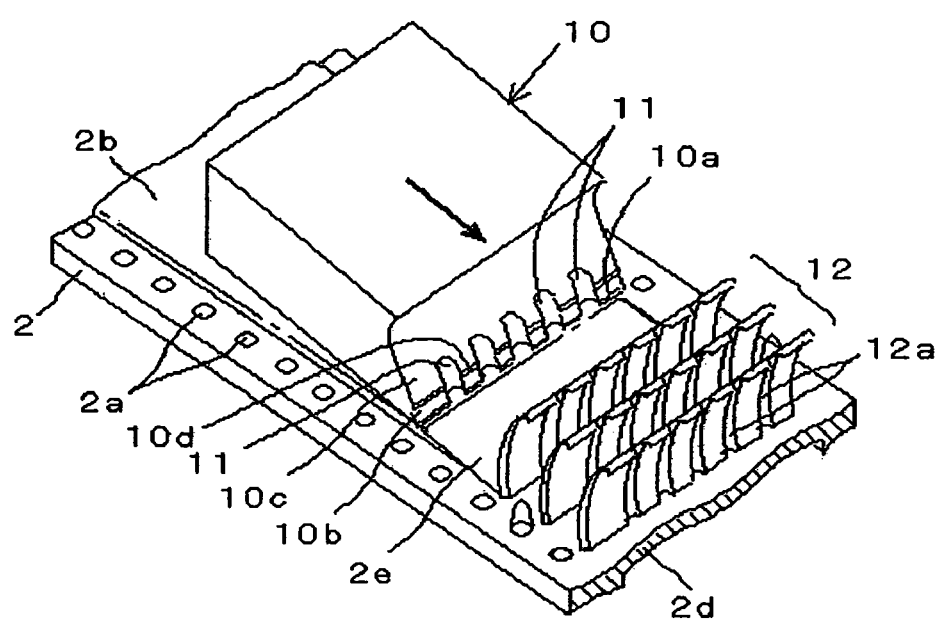
FIG. 10 is a perspective view depicting a method of manufacturing a radiator according to Example 2 of the present invention.

FIG. 10 depicts the second example of the present invention, and depicts a method of forming the heat-radiating fins with an even greater surface area in the radiator. A carving tool 10 used in this second example is substantially the same as the carving tool 7 used in the first example, but is different in that a plurality of concavities 11 are formed in a blade 10a perpendicular to the direction of movement in the distal end at the bottom surface. This carving tool 10 has two inclined surfaces 10b and 10c that are inclined at specific angles from the blade 10a, and a step 10d is formed between these two inclined surfaces 10b and 10c in the same manner as in the carving tool 7 shown in the first example.

Similar to the first example previously described, pilot holes 2a that function as positioning and interlocking parts are formed in the hoop-shaped metal plate 2 sequentially supplied from a supply device, a press tool 9 is pressed from the other side of the hoop-shaped metal plate 2, and a protruding pier 2b is formed in the front side. This pier 2b is formed into an arcuate shape in which the two lateral corners 2c are rounded out.

Then, after the hoop-shaped metal plate 2 in which the protruding pier 2b has been formed is positioned in the die, vertically rising heat-radiating fins 12 are formed by moving the carving tool 10 relative to the pier 2b of the hoop-shaped metal plate 2 in the same manner as in the first example previously described. At this time, since a plurality of concavities 11 are formed in the blade 10a of the carving tool 10, the heat-radiating fins 12 are carved out at a delay by the concavities 11. A plurality of concave grooves 12a with cross sections in a rough U shape are thereby formed in the heat-radiating fins 12 at positions corresponding to the concavities 11. The surface area of the heat-radiating fins 12 with the concave grooves 12a is greater than the surface area of heat-radiating fins with a flat surface. Therefore, the surface area of the heat-radiating fins 12 is greater than that of the heat-radiating fins 3 previously described, and the radiation efficiency of the radiator is therefore further improved. Also, in the heat-radiating fins 12 with a plurality of concave grooves 12a that have roughly U-shaped cross sections, both sides of the distal ends are formed into the same arcuate shapes as those formed at the both lateral corners of the pier 2b.

The shape of the concave grooves 12a can be widely varied by changing the shape of the plurality of concavities 11 formed in the blade 10a to a different shape. Also, uneven tongue-shaped fins can be formed upstream of the regular heat-radiating fins 12 formed by the blade 10a, by forming the concavities 11 even deeper. In this case, it is preferable to form a pier in a protruding manner that is substantially equal in height to the depth of the concavities 11 in the bottom surface of the carving tool 10, in order to make the height of the tongue-shaped fins equal to the height of the regular heat-radiating fins 12.

EXAMPLE 3

Figure 11:
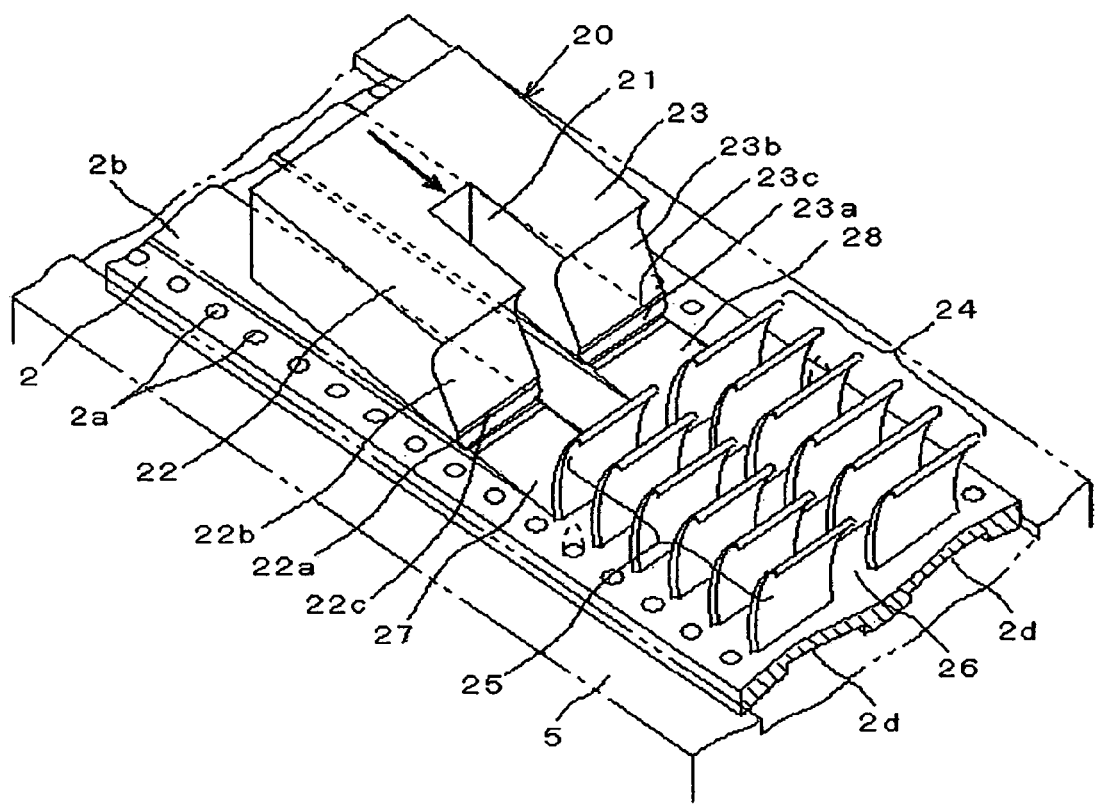
FIG. 11 is a perspective view depicting a method of manufacturing a radiator according to Example 3 of the present invention.

FIG. 11 depicts the third example of the present invention, and depicts a method of manufacturing a radiator with a configuration wherein a plurality of heat-radiating fin rows are formed simultaneously in the hoop-shaped metal plate 2. A carving tool 20 used in the third example is also substantially the same as the carving tool 7 used in the first example, but is different in that a pair of blades 22 and 23 are formed by forming a deep dividing groove 21 in the middle of the blade perpendicular to the movement direction at the distal end on the side of the bottom surface to divide the blade in two, as shown in FIG. 11. Also, in the carving tool 20, two pairs of inclined surfaces 22a, 22b and 23a, 23b that are inclined at specific angles from the blades 22 and 23 are formed, and steps 22c and 23c are formed between these two pairs of inclined surfaces 22a, 22b and 23a, 23b.

Pilot holes 2a that function as positioning and interlocking parts are formed in the hoop-shaped metal plate 2 sequentially supplied from a supply device, a press tool 9 is pressed from the back surface of the hoop-shaped metal plate 2 to form two concavities 2d, and two protruding piers 2b are formed in the front side. The width of these piers 2b corresponds to the width of a pair of left and right heat-radiating fins 24 and 25 described later. Also, the piers 2b are also formed into arcuate shapes by rounding out the two lateral corners 2c.

After the hoop-shaped metal plate 2 in which the protruding piers 2b have been formed is mounted and positioned on the die 5, a pair of left and right heat-radiating fins 24 and 25 are simultaneously formed vertically upward by moving the carving tool 20 to carve out the two piers 2b of the hoop-shaped metal plate 2 in the same manner as in the first example previously described. Also, a separation zone 26 with a width corresponding to the dividing groove 21 of the carving tool 20 is formed between the pair of left and right heat-radiating fins 24 and 25.

Furthermore, in order to form the next heat-radiating fins vertically upward, the hoop-shaped metal plate 2 is moved downstream and is positioned by the pilot pins formed in the die 5, the blades 22 and 23 of the carving tool 20 are then brought into contact farther upstream than a pair of left and right worked surfaces 27 and 28 formed by the previously formed vertically raised pair of left and right heat-radiating fins 24 and 25 as previously described, and the carving tool 20 is moved to form the next pair of left and right heat-radiating fins 24 and 25 vertically upward. A plurality of heat-radiating fins 24 and 25 are formed continuously at a specific pitch by subsequently repeating this raising formation step. After a heat-radiating fin row consisting of a plurality of heat-radiating fins 24 and a heat-radiating fin row consisting of a plurality of heat-radiating fins 25 are thus formed, they are cut at the cut lines CT as described in FIG. 7, whereby a radiator is manufactured with two rows of heat-radiating fins. The two rows of heat-radiating fins 24 and 25 have both sides of the distal ends formed into the same arcuate shapes that are formed at the two lateral corners of the piers 2b.

In the third example of the present invention as described above, two rows of heat-radiating fins 24 and 25 were formed in one radiator, but it is also possible to form three or more piers 2b with a press tool in the front surface of the hoop-shaped metal plate 2, and then simultaneously form three or more rows of heat-radiating fins vertically upward in the hoop-shaped metal plate 2 with a carving tool 20 in which three or more dividing grooves 21 are formed. Also, two rows of heat-radiating fins may be formed in one radiator as described above, but manufacturing may also involve simultaneously forming two radiators by cutting the metal plate at the portion of the separation zone 26. When three or more rows of heat-radiating fins are formed vertically upward, the metal plate may be cut at the position of each separation zone to simultaneously manufacture three or more radiators, or the metal plate may be cut at a specific position of the separation zone to manufacture two or more radiators, and the number of heat-radiating fin rows formed vertically upward in the hoop-shaped metal plate 2, or the number of divisions, can be appropriately set.

Figure 12:
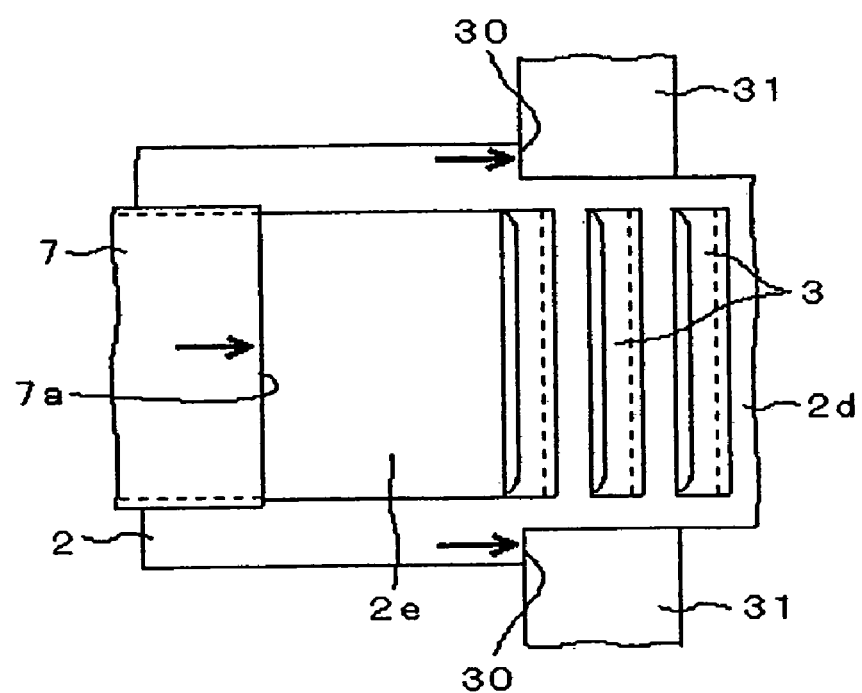
FIG. 12 is a plan view depicting a modification of a positioning means in the method of manufacturing the radiator of the present invention.

FIG. 12 depicts a modification of the positioning means for the hoop-shaped metal plate 2 that can be applied to each of the examples described above. For example, for the positioning means in the first example, the pilot holes 2a are formed at the same pitch as the heat-radiating fins 3 by an press device that is not shown, and positioning is performed by fitting the pilot holes 2a over pilot pins 6 provided to the die 5. When the pitch at which the heat-radiating fins 3 are formed is reduced, the interval between the pilot holes 2a must also be reduced. However, since pressure is applied to the pilot holes 2a when the heat-radiating fins 3 are formed vertically upward by carving out the hoop-shaped metal plate 2 with the carving tool 7, there is a limit to how much the interval between the pilot holes 2a can be reduced.

In view of this, the positioning means shown in FIG. 12 is designed such that notches 30 are formed in both sides of the hoop-shaped metal plate 2 every time the heat-radiating fins 3 are formed vertically upward, a pilot platform 31 is provided to the die 5, the hoop-shaped metal plate 2 is positioned by coming into contact with the notches 30, and the pressure exerted during carving is received. With this positioning means, the pitch at which the heat-radiating fins 3 are formed can be reduced because the notches 30 can be formed to arbitrary dimensions. Also, it is possible to form the heat-radiating fins 3 at an arbitrary pitch because the interval between the notches 30 can be arbitrarily set.

EXAMPLE 4

Figure 13:
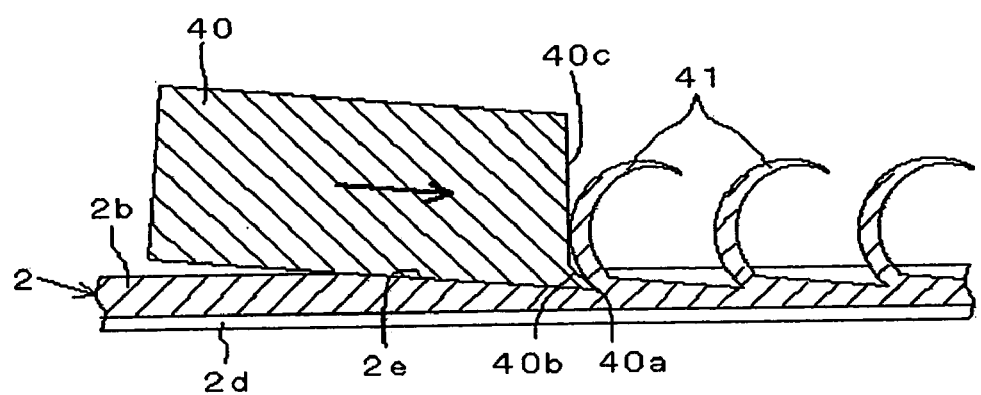
FIG. 13 is a cross-sectional view depicting the heat-radiating fin formation step of a radiator according to Example 4 of the present invention.

FIG. 13 depicts the fourth example of a radiator having heat-radiating fins curved into a rough arcuate shape. A carving tool 40 used in the fourth example has an inclined surface 40b that is inclined at a specific angle from a blade 40a perpendicular to the direction of movement formed at the distal end of the bottom surface, and an inclined surface 40c substantially perpendicular to the bottom surface of the carving tool 40 formed relatively near the inclined surface 40b.

A heat-radiating fin 41 is formed vertically upward by moving the carving tool 40 to carve out the positioned hoop-shaped metal plate 2. At first, the metal plate is carved out by the blade 40a of the carving tool 40, but as the height of the heat-radiating fin 41 subsequently increases, the distal end comes into contact with the inclined surface 40c and curves as its direction changes, and a roughly arcuate, a heat-radiating fin 41 is formed vertically upward as carving is performed with the carving tool 40. After the heat-radiating fin 41 is thus formed, the hoop-shaped metal plate 2 is moved at a specific pitch, the blade 40a of the carving tool 40 is brought into contact farther upstream than a worked surface 42 formed by the vertically raised heat-radiating fin 41 previously formed, and the carving tool 40 is moved to form the next roughly arcuate, vertically raised heat-radiating fin 41. A plurality of heat-radiating fins 41 are subsequently formed in a continuous manner at a specific pitch in the hoop-shaped metal plate 2 by repeating the raising formation step. A radiator is manufactured by cutting at the positions of cut lines CT as described in FIG. 8 after the plurality of heat-radiating fins 41 have thus been formed.

The height H of the radiator can be controlled by forming the heat-radiating fins 41 in rough cylindrical shapes in this manner, and a thin radiator can be manufactured. The radiation efficiency does not change because the entire length and the radiating surface area of the heat-radiating fins 41 are the same even with thin fins. Conversely, when the roughly cylindrical heat-radiating fins 41 are cooled from the transverse direction by a fan, it is possible to increase the cooling efficiency because the flow path of the cooled air is controlled by the cylindrical shape.

EXAMPLE 5

Figure 14:
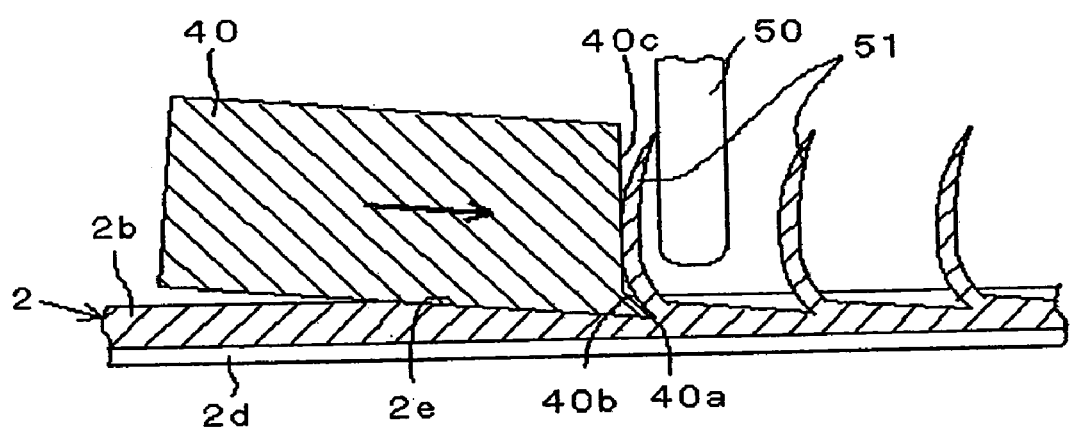
FIG. 14 is a cross-sectional view depicting the heat-radiating fin formation step of a radiator according to Example 5 of the present invention.

FIG. 14 depicts the fifth example of a radiator having heat-radiating fins formed vertically upward substantially perpendicular to the hoop-shaped metal plate 2. A carving tool in the fifth example can be either the carving tool 7 shown in the first example, the carving tool 40 shown in the fourth example, or the like. A description will now be given on the assumption that the carving tool 40 in FIG. 12 is used. When the carving tool 40 is moved to carve out the hoop-shaped metal plate 2, a controlling member 50 is disposed near the carving tool 40. Heat-radiating fins 51 are formed vertically upward by moving the carving tool 40 to carve out the positioned hoop-shaped metal plate 2 as previously described, but when the heat-radiating fins 51 would normally curve as they increase in height, the distal ends of the heat-radiating fins 51 come into contact with the controlling member 50 and change to a direction nearly perpendicular to the hoop-shaped metal plate 2. Then, the distal ends of the heat-radiating fins 51 rise further up along the controlling member 50 as their height increases, and when the carving tool 40 has moved to a specific position, heat-radiating fins that rise vertically in a substantially perpendicular manner are formed.

The controlling member 50 is lowered from above and is set every time prior to the formation of the vertically raised heat-radiating fin 51 by the carving tool 40. The curvature of the vertically raised heat-radiating fins 51 thus formed is corrected by the interval between the controlling member 50 and the carving tool 40 through a reduction in the interval, making it possible to form substantially flat heat-radiating fins 51.

EXAMPLE 6

Figure 15:
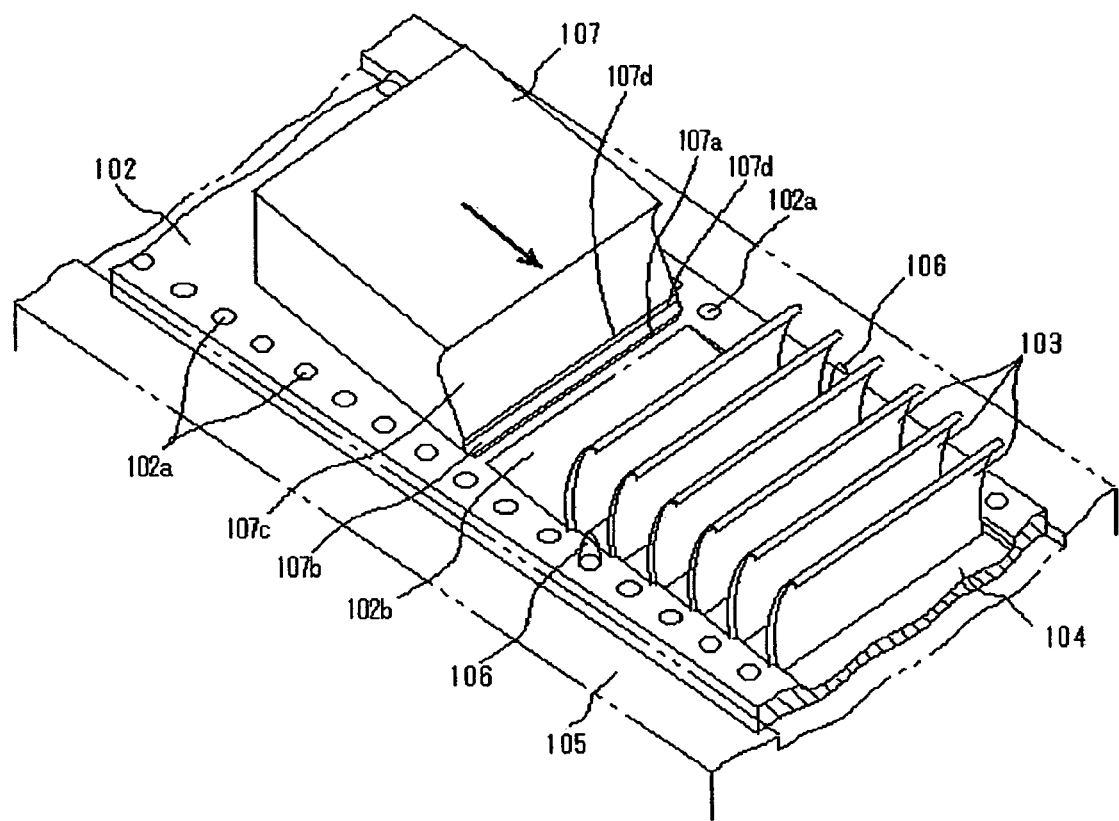
FIG. 15 is a cross-sectional view depicting a method of manufacturing a radiator according to Example 6 of the present invention.

A hoop-shaped metal plate 102 has the thickness and width necessary for forming a radiator 100, and, as is well known, the plate is formed to have a continuous length and is wound around a supply device (not shown) on the right-hand side in FIG. 15. Pilot holes 102a that function as positioning devices and stoppers are bored with a press device (not shown) in advance in the hoop-shaped metal plate 102 sequentially supplied from the supply device at nearly the same pitch as that at which the heat-radiating fins 103 are formed. The hoop-shaped metal plate 102 thus provided with the pilot holes 102a is mounted on the die 105 shown in FIG. 1. At this time, the pilot holes 102a fit over pilot pins 106 provided to the die 105, and the position of the hoop-shaped metal plate 102 is set. Heat-radiating fins 103 are then formed vertically upward with a carving tool 107 in the hoop-shaped metal plate 102 mounted on the die 105. The carving tool 107 is similar to the previously described carving tool 7 shown in FIG. 9, and descriptions thereof are omitted.

First, as shown in FIG. 17(A), the carving tool 107 is brought into contact with one side of the hoop-shaped metal plate 102, and the carving tool 107 is then moved to the other side of the hoop-shaped metal plate 102 at a specific angle by the aforementioned drive device. Then, as shown in FIG. 17(B), the hoop-shaped metal plate 102 is carved out by a blade 107a at the distal end of the carving tool 107, and the distal end of the thin heat-radiating fin 103 is raised vertically. When the distal end of the heat-radiating fin 103 reaches a step 107d in the carving tool 107, the distal end of the heat-radiating fin 103 is curved by the top edge and caused to change direction. When the carving tool 107 is moved further, the hoop-shaped metal plate 102 is carved out gradually deeper, the heat-radiating fin 103 grows longer, and a concavity 104 is formed, as shown in FIG. 17(C). When the hoop-shaped metal plate 102 is thus carved out, tapered blades 107f formed at both sides of the distal end of the carving tool 107 cut both walls of the concavity 104. Then, when the carving tool 107 is moved to a specific position as shown in FIG. 17(D), the heat-radiating fin 103 of a specific height is formed vertically upward from within the concavity 104 in the hoop-shaped metal plate 102, and a worked surface 102b is formed in the concavity 104. The carving tool 107 then retracts and returns to a standby position.

Figure 17:
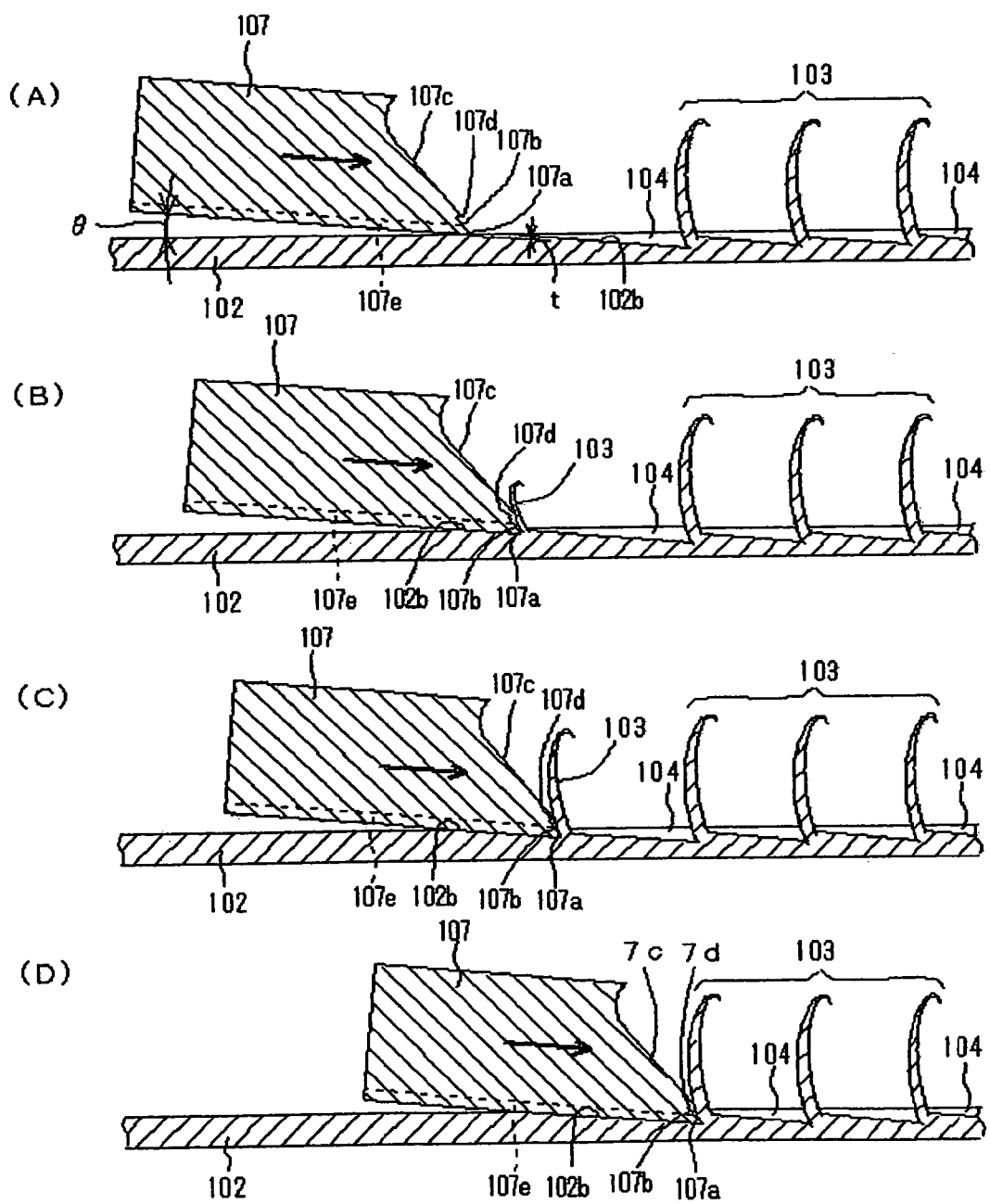
FIGS. 17(A) through 17(D) are explanatory diagrams depicting the heat-radiating fin formation step of the radiator according to Example 6 of the present invention.

After the heat-radiating fin 103 is formed vertically upward, the next heat-radiating fin 103 is formed, whereupon the hoop-shaped metal plate 102 is moved downstream to the right in FIG. 17, and the pilot holes 102a fit over the pilot pins 106 provided to the die 105 to set the position of the hoop-shaped metal plate 102. The carving tool 107 is then moved and the blade 107a comes into contact farther upstream than the worked surface 102b, as shown in FIG. 17(A). This contact position is set to a position that results in a specific carving depth t in the other side of the hoop-shaped metal plate 102 from the worked surface 102b. The carving depth t is set to about 0.3 mm to 0.8 mm.

The carving tool 107 is then moved at a specific angle towards the other side of the hoop-shaped metal plate 102, the hoop-shaped metal plate 102 is carved out by the blade 107a at the distal end of the carving tool 107, and the distal end of the thin heat-radiating fin 103 is oriented vertically upward as shown in FIG. 17(B). At this time, the distal end of the heat-radiating fin 103 is made to curve and change direction by the step 107d of the carving tool 107. When the carving tool 107 is moved further, the hoop-shaped metal plate 102 is carved out gradually deeper as shown in FIG. 17(C), the heat-radiating fin 103 grows longer, and the concavity 104 is formed. In this case as well, the tapered blades 107f formed at both sides of the distal end of the carving tool 107 cut both walls of the concavity 104, as previously described. When the carving tool 107 is moved to a specific position as shown in FIG. 17(D), the heat-radiating fin 103 of a height substantially equal to that of the previously formed heat-radiating fin 3 is formed vertically upward from within the concavity 104 of the hoop-shaped metal plate 102, and the worked surface 102b is formed in the concavity 104. The carving tool 107 then again retracts and returns to the standby position.

Furthermore, in order to form the next heat-radiating fin 103 vertically upward, the hoop-shaped metal plate 102 is moved downstream and is positioned by the pilot pins 106 formed in the die 105, the blade 107a of the carving tool 107 is then brought into contact farther upstream than the worked surface 102b, and the carving tool 107 is moved to form the heat-radiating fin 103 vertically upward, as previously described. A plurality of heat-radiating fins 103 are formed continuously at a specific pitch on the hoop-shaped metal plate 102, as shown in FIG. 20, by subsequently repeating this raising formation step.

Figure 20:
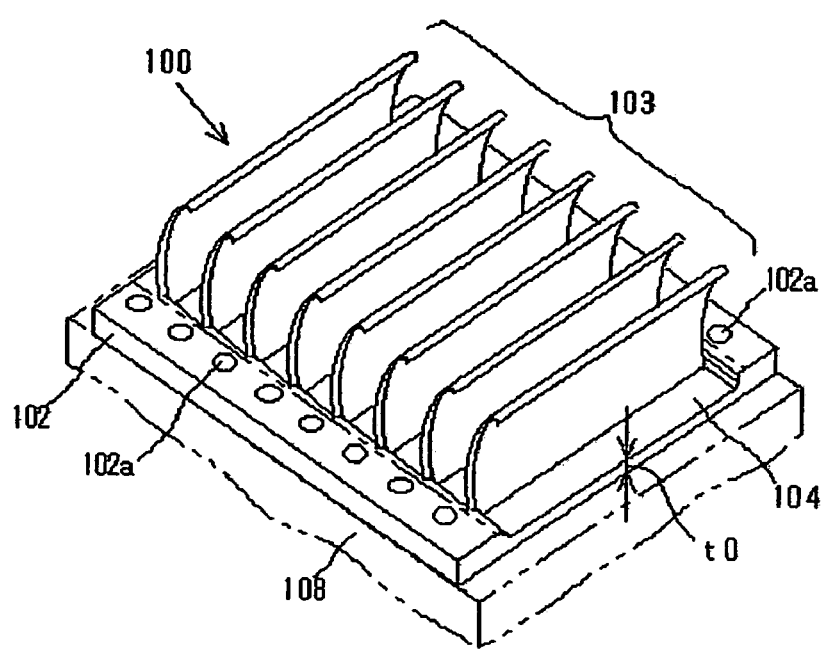
FIG. 20 is a perspective view depicting a radiator according to Example 6 of the present invention.

After the heat-radiating fins 103 are thus formed, the metal plate is cut at certain locations at intervals of a specific number of heat-radiating fins 103, and the radiator 100 shown in FIG. 20 is manufactured. The pilot holes 102a used in the raising formation step of the heat-radiating fins 103 remain in the radiator 100 shown in FIG. 20, and these pilot holes 102a may be either entirely or partially left in to be used as mounting holes, or, if necessary, the pilot holes 102a may be removed by cutting at the two lateral positions of the heat-radiating fins 103. Furthermore, both sides of the heat-radiating fins 103 may be modified to the appropriate shape.

Figure 16:
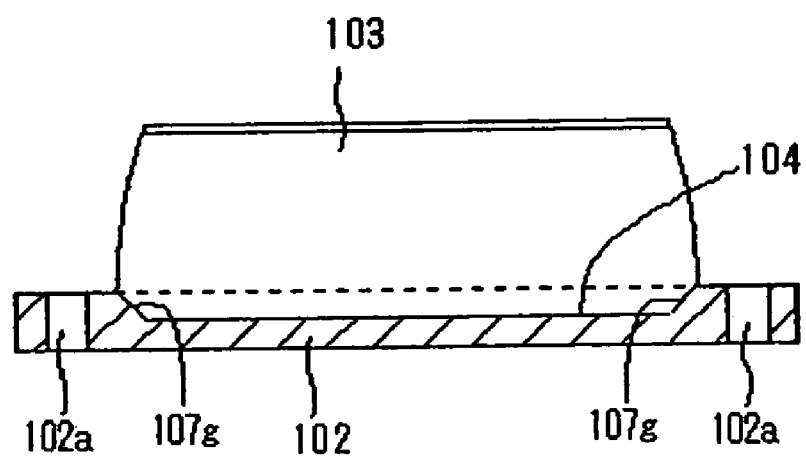
FIG. 16 is a cross-sectional view depicting a radiator according to Example 6 of the present invention.
Figure 18:
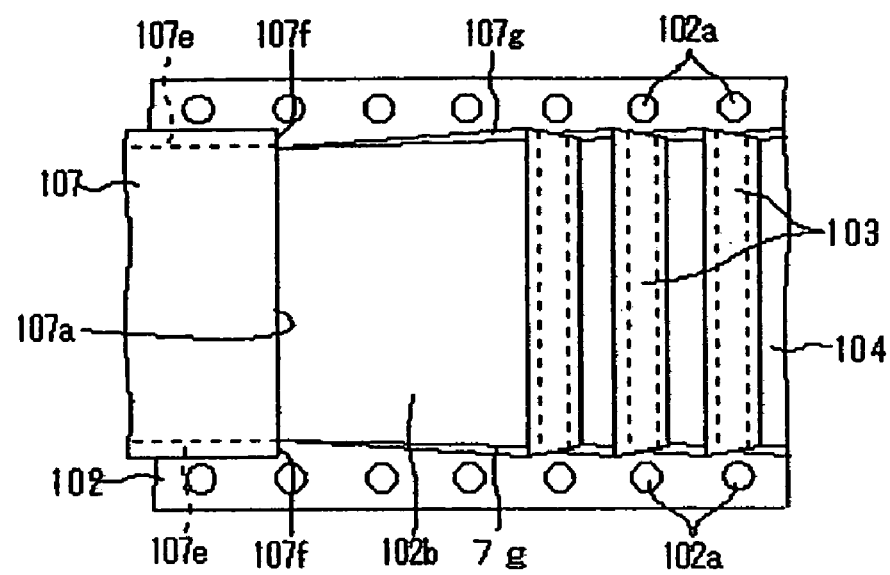
FIG. 18 is a plan view depicting the heat-radiating fin formation step of the radiator according to Example 6 of the present invention.
Figure 19:
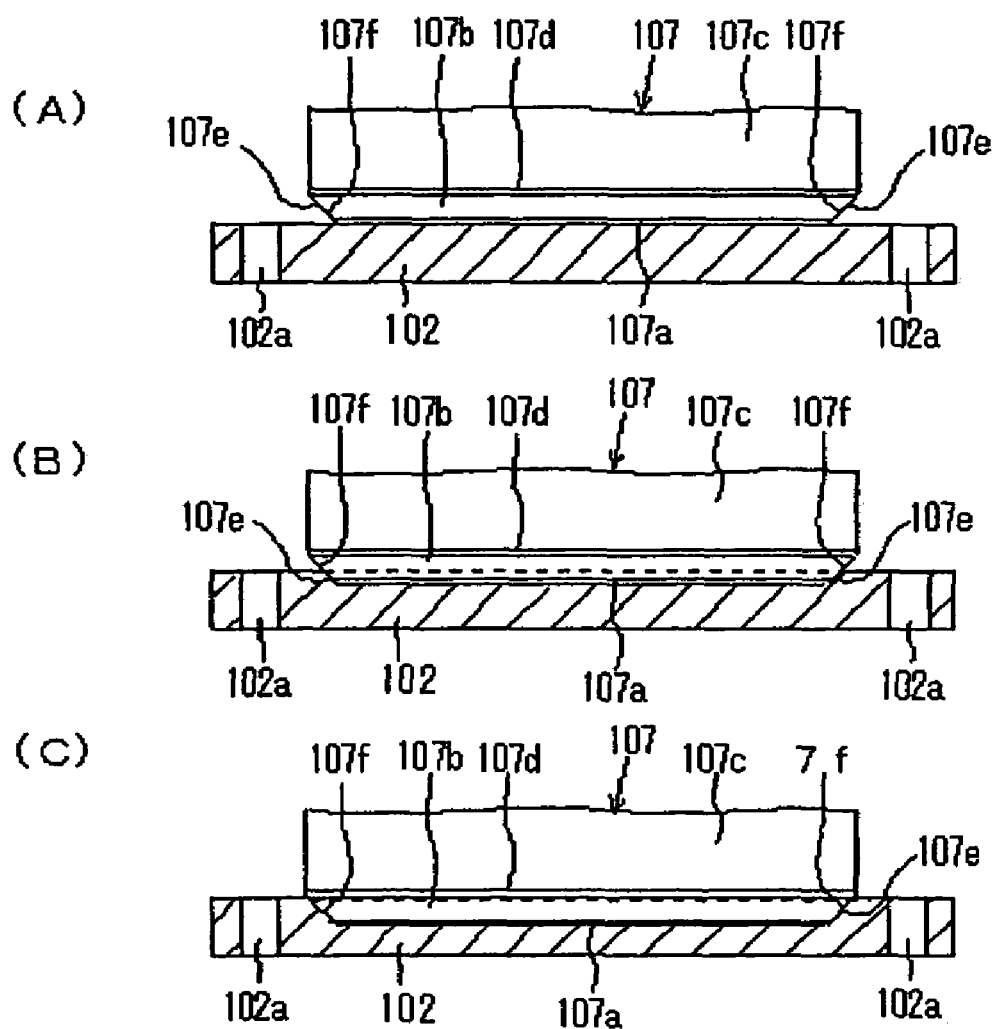
FIGS. 19(A) through 19(C) are explanatory diagrams depicting the heat-radiating fin formation step of the radiator in FIG. 17 as seen from a perpendicular direction.

Tapered surfaces 107e parallel to the direction of movement are formed on both sides of the bottom surface of the carving tool 107 as previously described, and the tapered blade 107f is formed at the distal end thereof. When the carving tool 107 is moved to carve out the hoop-shaped metal plate 102, because both walls of the concavity 104 are cut by the tapered blade 107f as the carving tool 107 goes deeper into the hoop-shaped metal plate 102 as shown in FIGS. 19(A) through 19(C), the transverse width of the concavity 104 gradually increases downstream, as shown in FIG. 18. The heat-radiating fins 103 are thereby formed into a rough trapezoid shape that is narrow at the distal end and widens down to the base, as shown in FIG. 16. Also, when the next heat-radiating fin 103 is formed after the previously formed heat-radiating fin 103, the tapered cut surfaces 107g of both walls cut by the tapered blade 107f are also carved out in an integral manner. For example, forming both sides of the carving tool 107 as right angles leads to problems in that one wall of the concavity 104 is cut and thread-like cuttings are produced when the positions of the carving tool 107 and the hoop-shaped metal plate 102 in the width direction become misaligned relative to each other. Forming tapered blades 107f at both sides of the carving tool 107 prevents the occurrence of thread-like cuttings in advance even when the carving tool 107 and the hoop-shaped metal plate 102 become misaligned in the width direction, because the tapered cut surfaces 107g are also carved out by the tapered blades 107f.

Thus, concavities 104 are formed in one side of the hoop-shaped metal plate 102 by carving out the hoop-shaped metal plate 102 with the carving tool 107 and forming heat-radiating fins 103 vertically upward. The thickness to of the concavities 104 to the heat-radiating fins 103 in the radiator 100 is thereby reduced. When the radiator 100 is bonded to a package 108 for housing semiconductor integrated circuits as shown, for example, in FIG. 20, radiation efficiency can be increased because the heat produced from the semiconductor integrated circuits is quickly transmitted to the heat-radiating fins 103 and is radiated from the heat-radiating fins 103.

OTHER EXAMPLES

In the examples described above, heat-radiating fins were formed vertically upward by moving the carving tool while the hoop-shaped metal plate was fixedly positioned. Conversely, another possibility is to form the heat-radiating fins by fixing the carving tool in place and moving the hoop-shaped metal plate, or to form the heat-radiating fins vertically upward by moving the hoop-shaped metal plate and the carving tool relative to each other. Also, a flat radiator was manufactured by cutting the hoop-shaped metal plate with a plurality of heat-radiating fins formed vertically upward, but according to the method for manufacturing a radiator of the present invention, it is also possible to curl a rectangular radiator with multiple heat-radiating fins formed vertically upward to manufacture a cylindrical radiator, for example. It is also possible to manufacture a polygonal cylindrical radiator by bending a rectangular radiator at specific dimensions. Furthermore, when the surface of a device for which heat radiation is a requirement is curved, a radiator having the same curved surface may be manufactured and joined to this device, and the radiator can be modified into various shapes according to the application. Also, examples were given in which identical heat-radiating fins were continuously formed vertically upward in a hoop-shaped metal plate, but various radiators may also be manufactured continuously by forming heat-radiating fins vertically upward with a certain shape or pitch and then forming heat-radiating fins vertically upward with a different shape or pitch. Furthermore, the entire length of the hoop-shaped metal plate is not an issue if the hoop-shaped metal plate is a metal strip and has a length whereby a plurality of radiators can be manufactured from this metal plate. Thus, the present invention is not limited to these examples, and various modifications can be made within a range that does not deviate from the present invention.

Also, the present invention can be applied to radiators for cooling semiconductor integrated circuits and other such electronic components, to heat sinks, to radiators for dissipating heat produced from a heating element, and to other such radiators.

The invention claimed is:

1. A method of manufacturing a radiator wherein a plurality of thin-plate heat-radiating fins are raised vertically from a first surface of a metal plate, comprising:
   heat-radiating fin formation step for applying a blade of a carving tool to a first surface of a metal plate and for advancing the blade in relative fashion in a direction inclined by a specific angle along the first surface, whereby the blade is dug in towards a second surface of the metal plate to form a plate-shaped heat-radiating fin that rises vertically from a portion on a side of the first surface of the metal plate; and
   tool retraction step for retracting the blade relative to the formed heat-radiating fin by a specific pitch along the first surface of the metal plate; wherein
   the heat-radiating fin formation step and the tool retraction step are repeated to form a plurality of the heat-radiating fins at a specific pitch in the first surface of the metal plate; and wherein the carving tool has a blade extending in a direction perpendicular to a carving direction in a distal end at a bottom thereof, and a tapered blade is formed at both ends of the blade.

2. The method of manufacturing a radiator according to claim 1, wherein the metal plate is a continuous plate with a specific width;
   the blade of the carving tool is advanced in relative fashion in a length direction of the metal plate in the heat-radiating fin formation step; and
   the heat-radiating fins extending in a width direction of the metal plate are formed at a specific pitch along the length direction of the metal plate.

3. The method of manufacturing a radiator according to claim 2, further including a cutting step wherein, after the plurality of heat-radiating fins are formed, the metal plate is cut out at each portion in which a specific number of the heat-radiating fins is formed to manufacture a plurality of radiators.

4. The method of manufacturing a radiator according to claim 1, wherein the blade surface of the carving tool comprises a first inclined surface that is inclined rearward from the distal end of the bottom surface at a specific angle, a stepped surface that protrudes forward from a top end of the first inclined surface at a specific angle, and a second inclined surface that is inclined rearward from a top end of the stepped surface at a specific angle; and a portion where the bottom surface and the first inclined surface intersect constitutes the blade; and
   in the heat-radiating fin formation step, the heat-radiating fins carved out by the blade are curled by the corner portion between the stepped surface and the second inclined surface.

5. A method of manufacturing a radiator wherein a plurality of thin-plate heat-radiating fins are raised vertically from a first surface of a metal plate, comprising:
   a heat-radiating fin formation step for applying a blade of a carving tool to a first surface of a metal plate and for advancing the blade in relative fashion in a direction inclined by a specific angle along the first surface, whereby the blade is dug in towards a second surface of the metal plate to form a plate-shaped heat-radiating fin that rises vertically from a portion on a side of the first surface of the metal plate;

a tool retraction step for retracting the blade relative to the formed heat-radiating fin by a specific pitch along the first surface of the metal plate; wherein the heat-radiating fin formation step and the tool retraction step are repeated to form a plurality of the heat-radiating fins at a specific pitch in the first surface of the metal plate;

a thickness of the portions of the metal plate between adjacent heat-radiating fins is less than a thickness of the other portions of the metal plate; and a pier formation step preceding the heat-radiating fin formation step, wherein the second surface on the side opposite from the first surface in the metal plate is pressed toward the first surface by a pressing tool, and a pier smoothed off at the two lateral corners is formed in the first surface of the metal plate, wherein in the heat-radiating fin formation step, heat-radiating fins whose both lateral portions at the distal ends are circular or chamfered are formed by carving out the pier with a carving tool in which a blade is formed wider than a width of the pier.

6. The method of manufacturing a radiator according to claim 5, wherein interlocking parts for fixing the metal plate in place are formed in both ends of the metal plate;

the pier is formed in a portion of the metal plate between the interlocking parts in the pier formation step; and the interlocking parts are used to fix the metal plate in place during the heat-radiating fin formation step, and the carving tool is moved.

\* \* \* \* \*